United States Patent [19]
Tsutsumi et al.

[11] Patent Number: 6,115,828
[45] Date of Patent: Sep. 5, 2000

[54] METHOD OF REPLACING FAILED MEMORY CELLS IN SEMICONDUCTOR MEMORY DEVICE

[75] Inventors: Tetsuji Tsutsumi; Toshiyuki Nishii; Masayuki Takeshige, all of Kasugai, Japan

[73] Assignee: Fujitsu Limited, Kanagawa, Japan

[21] Appl. No.: 09/013,188

[22] Filed: Jan. 26, 1998

[30] Foreign Application Priority Data

Apr. 28, 1997 [JP] Japan .................................... 9-110967

[51] Int. Cl.[7] .................................................. G11C 11/40
[52] U.S. Cl. ...................... 714/7; 714/7; 714/8; 714/710; 365/200
[58] Field of Search ................................. 714/7, 8, 3, 25, 714/42, 53, 710, 723; 365/200, 201

[56] References Cited

U.S. PATENT DOCUMENTS

| | | | |
|---|---|---|---|
| 4,051,354 | 9/1977 | Choate | 714/11 |
| 4,380,066 | 4/1983 | Spencer et al. | 714/6 |
| 5,299,202 | 3/1994 | Vaillancourt | 714/718 |
| 5,416,740 | 5/1995 | Fujita et al. | 714/42 |
| 5,430,678 | 7/1995 | Tomita | 365/200 |
| 5,812,467 | 9/1998 | Pascucci | 365/200 |
| 5,889,710 | 3/1999 | Pascucci | 365/200 |
| 5,958,065 | 9/1999 | Klein | 714/5 |
| 5,969,906 | 9/1999 | Song | 365/200 |

FOREIGN PATENT DOCUMENTS 8-162538  6/1996  Japan .

*Primary Examiner*—Robert W. Beausoliel, Jr.
*Assistant Examiner*—Bryce Bonzo
*Attorney, Agent, or Firm*—Arent Fox Kintner Plotkin & Kahn

[57] ABSTRACT

A memory having a plurality of memory cells and a plurality of redundant memory cells accesses a redundant memory cell in lieu of a failed memory cell. The memory is tested for failed memory cells. Addresses of detected failed memory cells are stored in a first set of registers, and addresses of redundant memory cells are stored in a second, corresponding set of registers. An external address is compared with the address stored in the first set of registers and if there is a match, the corresponding redundant memory cell address stored in the second register set is used to access the memory, in lieu of the external memory address.

3 Claims, 10 Drawing Sheets

METHOD OF REPLACING FAILED MEMORY CELLS IN SEMICONDUCTOR MEMORY DEVICE

BACKGROUND OF THE INVENTION

The present invention relates generally to a method of replacing failed memory cells in a semiconductor memory device, and, more particularly, to a method for relieving failed memory cells by using redundant memory cells.

To decrease the size of computer systems, a large capacity memory is designed such that a plurality of functional block circuits, like a CPU, are integrated on the same LSI chip. Redundant memory cells are provided to relieve a memory cell when it fails. As shown in FIG. 1, a memory cell array 1 includes a plurality of bit lines BL and a plurality of word lines WL with memory cells C located at the individual intersections of the bit lines BL and the word lines WL. The memory cell array 1 further includes a redundant word line RW, a redundant bit line RB and a plurality of redundant memory cells RC. The redundant memory cells RC are located respectively at the intersections of the redundant word line RW and the individual bit lines BL, at the intersections of the redundant bit line RB and the individual word lines WL, and at the intersection of the redundant word line RW and the redundant bit line RB. A redundant cell row is formed along the redundant word line RW, and a redundant cell column is formed along the redundant bit line RB. The word lines WL, the redundant word line RW, the bit lines BL and the redundant bit line RB are connected via fuses H to a memory decoder 2.

When a memory cell CS at the second row and the first column fails, for example, the bit line BL or the word line WL which is associated with the failed memory cell CS is disconnected from the memory decoder 2. Then, a redundant memory cell in the redundant cell row or the redundant cell column is used in place of the failed memory cell. The location of the failed memory cell CS is specified in the first test based on the result of which decode line is physically switched. The switching is accomplished by the disconnection of the decode line by the fusion of the associated fuse H and a programming-based registration of the address of the failed memory cell CS. Next, a second test checks if switching of the failed memory cell to a redundant memory cell in the redundant cell row or the redundant cell column has been carried out properly. That is, second test checks that the disconnection of the decode line and the registration of the failure address have been correctly implemented.

The operation of functional block circuits on an LSI chip where a plurality of functional block circuits and a memory coexist is tested with a logic tester, while the operation of the memory is tested with a memory tester. Alternatively, the operations of both the functional block circuits and the memory are tested using the logic tester. An increase in the memory capacity leads to a longer time for testing an LSI. Since the switching from a failed memory cell to a redundant memory cell requires two tests and a physical switching task, the test time is further increased.

SUMMARY OF THE INVENTION

It is an object of the present invention to provide a method of decreasing the time for switching from a failed memory cell to a redundant memory cell.

Briefly stated, the present invention provides a method of accessing the memory having a plurality of memory cells and a plurality of redundant memory cells. The method includes the steps of: receiving an external memory address; comparing the external address with an address stored in a first register of at least one failed memory cell; and accessing a predetermined one of the redundant memory cells when the external memory address matches the address of the at least one failed memory cell using an address of the predetermined redundant memory cell which is stored in a second register.

The present invention further provides a method of converting an address of a failed memory cell to an address of one of the plurality of redundant memory cell. The method includes the steps of: testing the plurality of memory cells for failed memory cells; storing an address of a failed memory cell in a first register; storing an address of one of the redundant memory cells in a second register; comparing an external address with the address stored in the first register and generating a first comparison signal therefrom; and substituting the address stored in the second register for the external address, based upon the value of the first comparison signal, when the external address matches the address of the failed memory cell.

The present invention provides a method of converting an address of a failed memory cell to an address of a redundant memory cell. The memory cells is located at intersections of word lines and bit lines, and the redundant memory cells is located at intersections of a redundant word line and the bit lines and at intersections of the word lines and a redundant bit line. The method includes the steps of: preparing a row address for selecting a word line associated with a failed memory cell and a column address for selecting a bit line associated with the failed memory cell; preparing a redundant row address for selecting the redundant word line and a redundant column address for selecting the redundant bit line; comparing an external row address with the row address associated with the failed memory cell and comparing an external column address with the column address associated with the failed memory cell; converting the external row address to the redundant row address when the external row address coincides with the row address associated with the failed memory cell; and converting the external column address to the redundant column address when the external column address coincides with the column address associated with the failed memory cell.

The present invention further provides a semiconductor memory device including: a memory cell array including a plurality of memory cells and a plurality of redundant memory cells; a memory cell decoder for selecting one of the plurality of memory cells in accordance with an external address; an address comparison circuit having an address of a failed memory cell for comparing the external address with the address of the failed memory cell; and an address converter, connected between the address comparison circuit and the memory cell decoder, having an address of a redundant memory cell, for converting the external address to the address of the redundant memory cell when the external address coincides with the address of the failed memory cell.

The present invention provides a semiconductor memory device including: a memory cell array having a plurality of word lines, a plurality of bit lines, a plurality of memory cells and a plurality of redundant memory cells, the memory cells located at intersections of the word lines and the bit lines, the redundant memory cells located at intersections of a redundant word line and the bit lines and at intersections of the word lines and a redundant bit line; a row decoder for selecting one of the plurality of word lines in accordance with a row address; a column decoder for selecting one of the plurality of bit lines in accordance with a column address; a row address comparison circuit having a row address for selecting a word line associated with a failed memory cell, for comparing an external row address with the row address associated with the failed memory cell; a column address comparison circuit having a column address for selecting a bit line associated with the failed memory cell, for comparing an external column address with the column address associated with the failed memory cell; a row address switching circuit, connected between the row address comparison circuit and the row decoder and having a row address of a redundant memory cell and converting the external row address to a redundant row address when the external row address matches with the row address associated with the failed memory cell; and a column address converter, connected between the column address comparison circuit and the column decoder and having a column address of the redundant memory cell and converting the external column address to the redundant memory cell column address when the external column address matches the column address associated with the failed memory cell.

The present invention provides a semiconductor device comprising: a memory circuit having a plurality of memory cells and a plurality of redundant memory cells, for selecting one memory cell in accordance with an external address; a processing circuit connected to the memory circuit and having a plurality of processing stages including an access stage for accessing the memory circuit; and an address converter, connected to the processing circuit, for receiving an external address from the processing circuit for accessing the memory circuit, comparing the external address with an address of a failed memory cell, and converting the external address to an address of a redundant memory cell when the external address matches the address of the failed memory cell, wherein the processing circuit further has an address conversion stage performed by the address converter prior to the access stage, the processing circuit receives a converted address from the address converter in the address conversion stage and supplies the converted address to the memory circuit in the access stage.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings, in which.

DETAILED DESCRIPTION OF THE PREFERRED EMBODIMENTS

Figure 3:
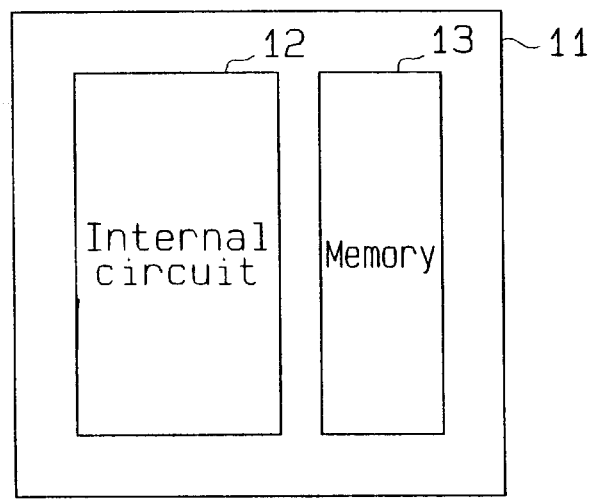
FIG. 3 is a block circuit diagram of a semiconductor device on which the memory in FIG. 2 is fabricated.

A semiconductor memory device according to the first embodiment of the present invention will now be described referring to the accompanying drawings. Referring to FIG. 3, a semiconductor device 11 includes an internal circuit 12 and a memory 13 formed on the same chip. The internal circuit 12 includes logic circuits like a CPU, and operates in accordance with various kinds of data including commands stored in the memory 13. The memory 13 preferably includes a dynamic random access memory (DRAM).

Figure 1:
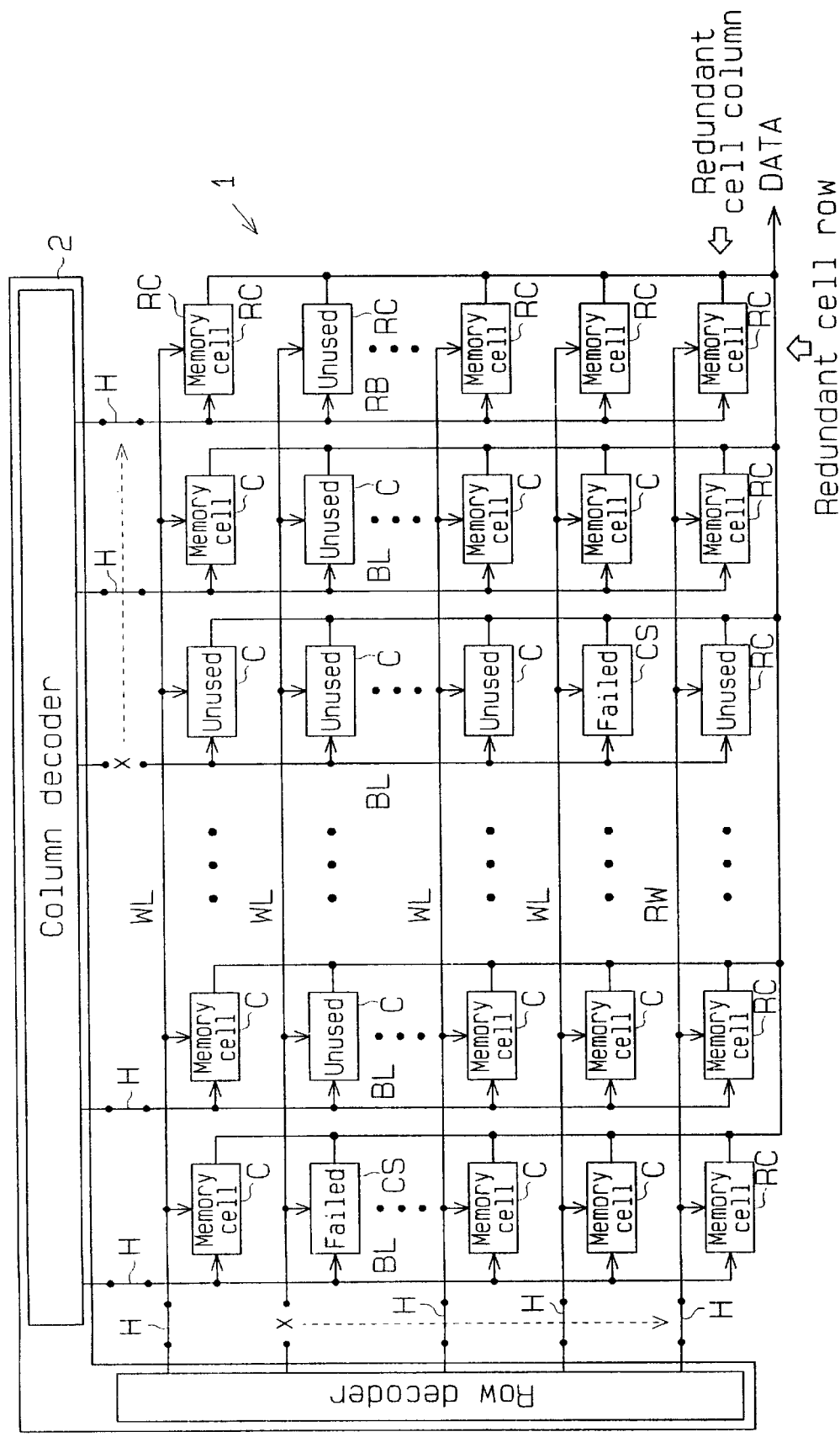
FIG. 1 is a block diagram of a conventional memory cell array which has memory cells and redundant memory cells.
Figure 2:
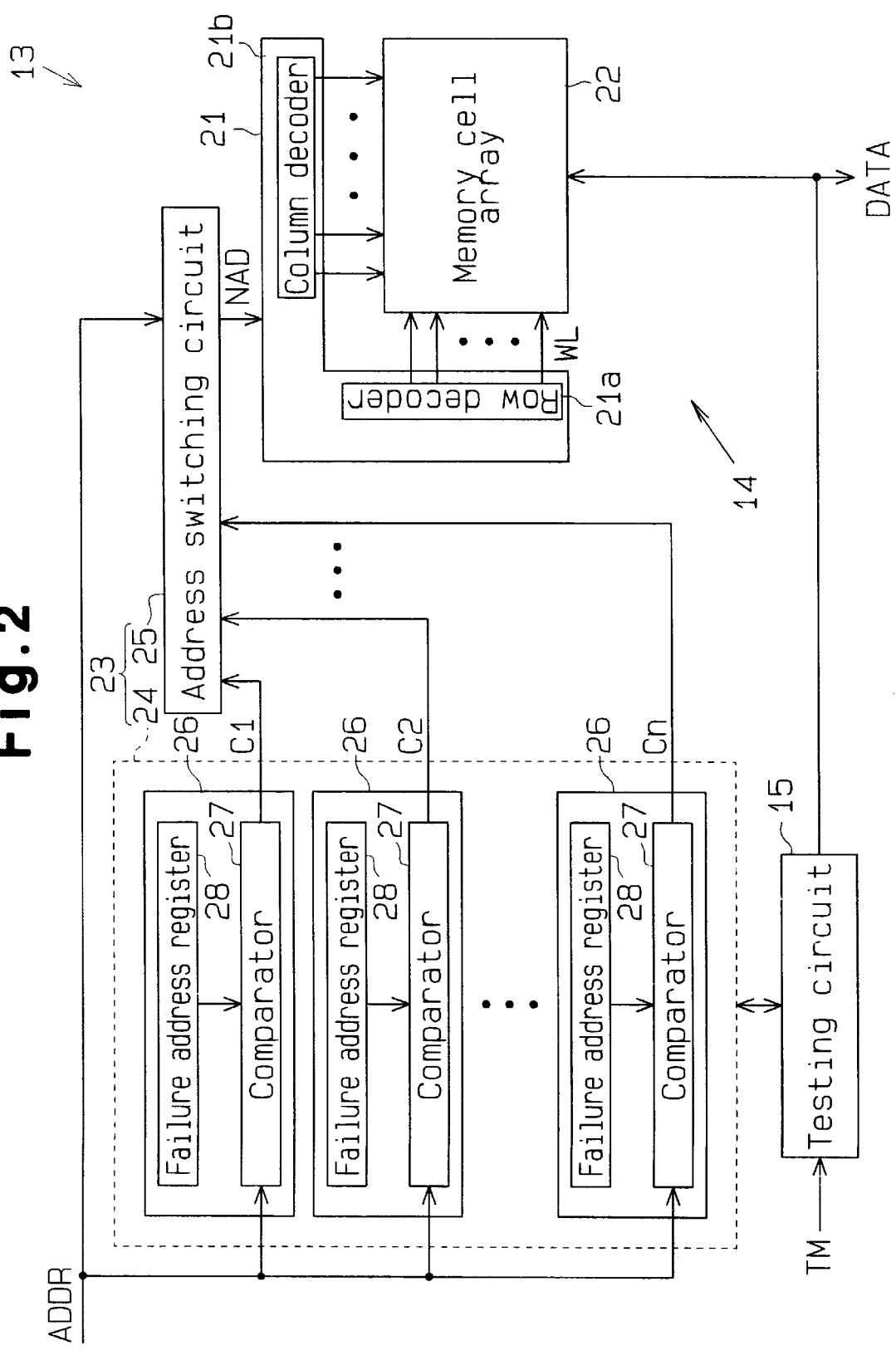
FIG. 2 is a schematic block diagram of a memory according to a first embodiment of the present invention.
Figure 4:
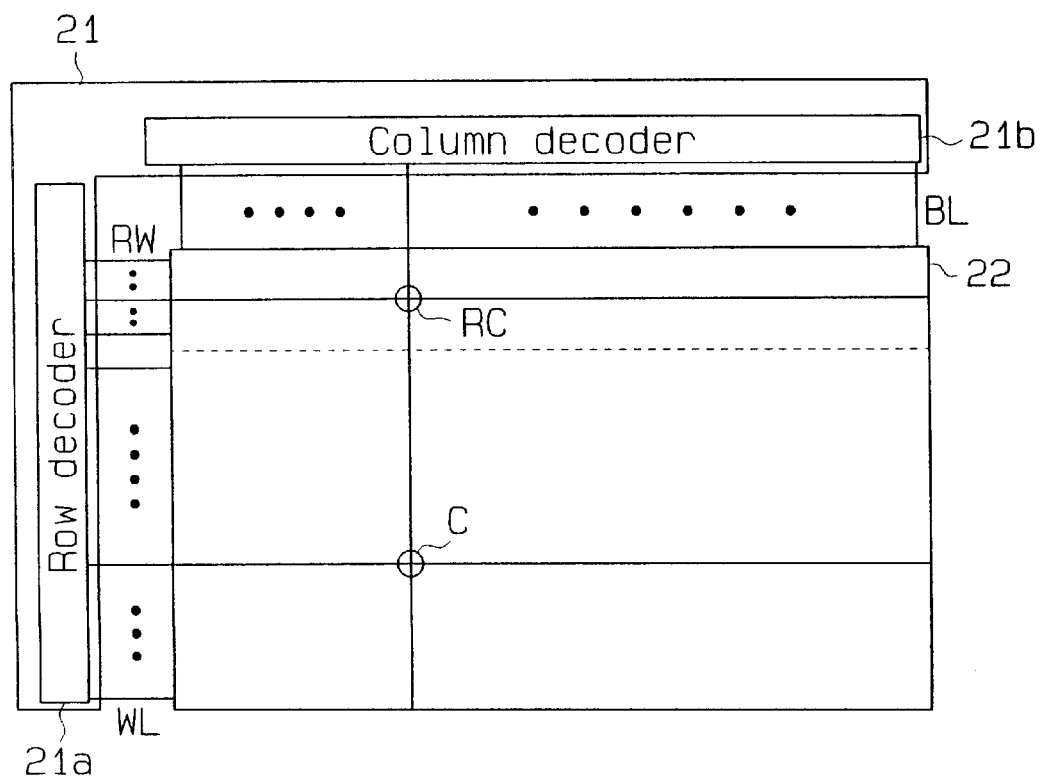
FIG. 4 is a schematic block diagram of a memory cell array in the memory in FIG. 2.

Referring to FIG. 2, the memory 13 includes a memory circuit section 14, a testing circuit 15 and a failure address converter 23. The memory circuit 14 has a memory cell decoder 21 and a memory cell array 22. As shown in FIG. 4, the memory cell array 22 has a plurality of word lines WL, a plurality of bit lines BL, a plurality of memory cells C and a plurality of redundant memory cells RC. The memory cells C are located at the individual intersections of the word lines WL and the bit lines BL. The redundant memory cells RC are located at the individual intersections of a redundant word line RWL and the bit lines BL. The individual word lines WL and the redundant word line RWL are connected to a row decoder 21a of the memory cell decoder 21, and the individual bit lines BL are connected to a column decoder 21b of the memory cell decoder 21.

Referring to FIG. 2, the memory cell decoder 21 receives an external address signal ADDR from an external unit (not shown) and decodes the external address ADDR to select (enable) a single word line WL and a single bit line BL. Consequently, the memory cell C at the intersection of the enabled word line WL and bit line BL is selected and cell information is written in, or read from, the selected memory cell C. The external address signal ADDR is preferably expressed by bits of 0h (h: hexadecimal notation) to (m−1)h corresponding to m memory cells C.

When one memory cell C fails, the failure address converter 23 operates to replace the failed memory cell C with a redundant memory cell RC. When the failed memory cell is selected by the external address ADDR, the failure address converter 23 operates to select the redundant memory cell in place of the failed memory cell. Specifically, the failure address converter 23 converts the selected address (failure address) of the failed memory cell to the selected address (redundant address or internal address) NAD of the redundant memory cell.

The failure address converter 23 includes an address comparison circuit 24 and an address switching circuit 25. The address comparison circuit 24 receives the external address ADDR and determines if the external address ADDR is a failure address. The address switching circuit 25 switches the external address ADDR with a redundant address based on the result of the determination by the address comparison circuit 24.

The address comparison circuit 24 has a plurality of (n) failure address comparators 26. It is preferable that the number of the failure address comparators 26 corresponds to the number of the redundant memory cells RC. Each failure address comparator 26 includes a comparator 27 and a failure address register 28.

Figure 5:
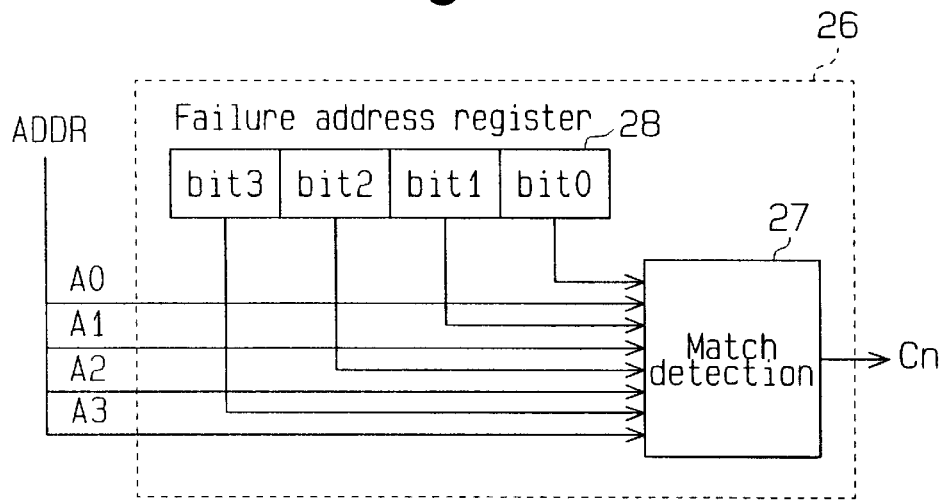
FIG. 5 is a schematic block diagram of a comparison circuit in the memory in FIG. 2.

As shown in FIG. 5, the failure address register 28 includes a plurality of bit registers which correspond in number to the bits of the address of a memory cell. The failure address register 28 stores the address of the failed memory cell. The failure address register 28 preferably includes a PROM, like OTPROM (one-time programable ROM), or EPROM (erasable and programable ROM), or a non-volatile memory, like NVRAM.

The comparator 27 receives the external address ADDR and the failure address from the failure address register 28 and compares these addresses with each other. The comparator 27 supplies a decision signal Cn representing the result of the comparison to the address switching circuit 25. Specifically, when the external address ADDR matches with the failure address, the decision signal Cn having a logic value of "1" (H level) is generated, whereas when the addresses do not match, the generated decision signal Cn has a logic value of "0" (L level).

When the number of failed memory cells is less than the number of the redundant memory cells, it is preferable that, a logic value of "1" is stored in every bit of the failure address register 28 where the failure address is not stored. In this case, the comparator 27 generates the decision signal Cn having a logic value of "0".

Figure 6:
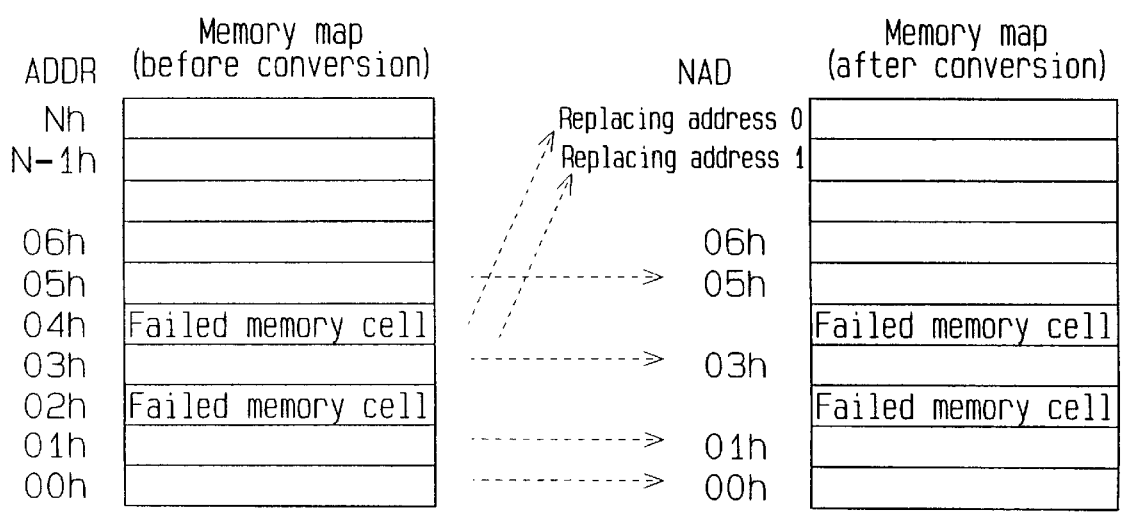
FIG. 6 shows a memory map before address conversion and a memory map after address conversion for correlation according to the first embodiment of the present invention.

Referring again to FIG. 2, the address switching circuit 25 prestores the redundant addresses of the redundant memory cells. The address switching circuit 25 receives the external address ADDR and decision signals C1 to Cn from the individual failure address comparators 26, and selectively switches the external address ADDR to the proper redundant address in accordance with the decision signals C1–Cn. FIG. 6 shows memory maps before and after address conversion according to the first embodiment.

Figure 7:
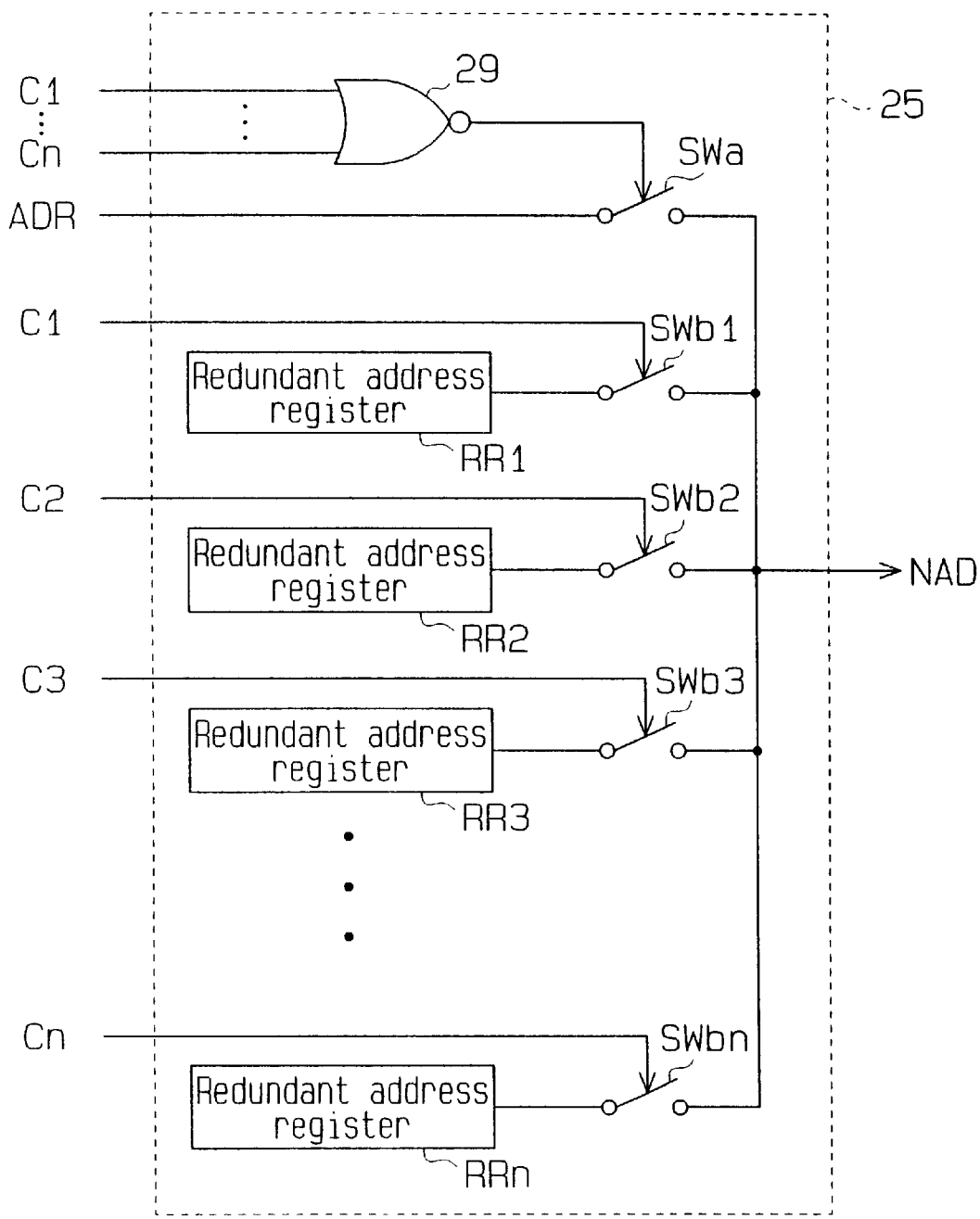
FIG. 7 is a schematic block diagram of an address switching circuit in the memory in FIG. 2.

FIG. 7 presents a schematic block diagram of the address switching circuit 25. The address switching circuit 25 includes a plurality of (n) redundant address registers RR1 to RRn, a first switch SWa, second switches SWb1 to SWbn and a NOR gate 29. The NOR gate 29 receives all of the decision signals C1–Cn and sends an H-level or L-level output signal to the first switch SWa. The first switch SWa and the second switches SWb1–SWbn each preferably comprise a transistor, such as a CMOS transistor. However, it will be understood that other switch implementation may be used, and may be preferable depending upon the circuit technology of the device.

The first switch SWa is switched on to permit the passing of the external address ADDR in response to the H-level output signal of the NOR gate 29. That is, the NOR gate 29 generates a high level output signal when all of the decision signals C1–Cn are low. As a result, the external address ADDR is supplied to the memory cell decoder 21.

The second switches SWb1–SWbn, respectively connected to the redundant address registers RR1–RRn, are switched on or off in response to the associated decision signals C1–Cn. The address of the redundant memory cells are prestored in the redundant address registers RR1–RRn. When one of the second switches SWb1–SWbn is switched on in response to the associated one of the decision signals C1–Cn which has an H level, the redundant address is output from the associated one of the redundant address registers RR1–RRn and from the address switching circuit 25. Thus the external address (failure address) is changed to the proper redundant address.

The row decoder 21a selects one of the word lines WL and the redundant word line in accordance with the external or redundant address received from the address switching circuit 25. The column decoder 21b selects one of the bit lines in accordance with the external or redundant address received from the address switching circuit 25. The memory cell or redundant memory cell at the intersection of the selected word line (or redundant word line) and the selected bit line is then selected.

The testing circuit 15 detects a failed memory cell in the memory cell array 22 in response to a test mode signal TM supplied from a testing device (not shown), and stores the address of the detected failed memory cell in an associated failure address register 28. The testing device is detachably connected to the semiconductor device, and outputs a signal necessary for testing the electrical characteristics of the internal circuit 12 and the memory 13 and performing failure detection on the memory cells. In the test mode, the testing circuit 15 writes predetermined information in the individual memory cells first, and then reads cell information stored in the individual memory cells. The testing device then compares written cell information with read cell information to detect a failed memory cell. The testing circuit 15 has a register (not shown) for storing predetermined write cell information.

The testing circuit 15 preferably performs a test when the memory 13 is powered on. The testing circuit 15 is set to the test mode when a supply voltage for the memory 13 is supplied. It is preferable that the testing circuit 15 has a counter which generates an address for testing a memory cell C. Performing a test upon power-on and storing a failure address in the failure address register allows a memory cell C, which has failed during power-on, to be relieved.

Figure 8:
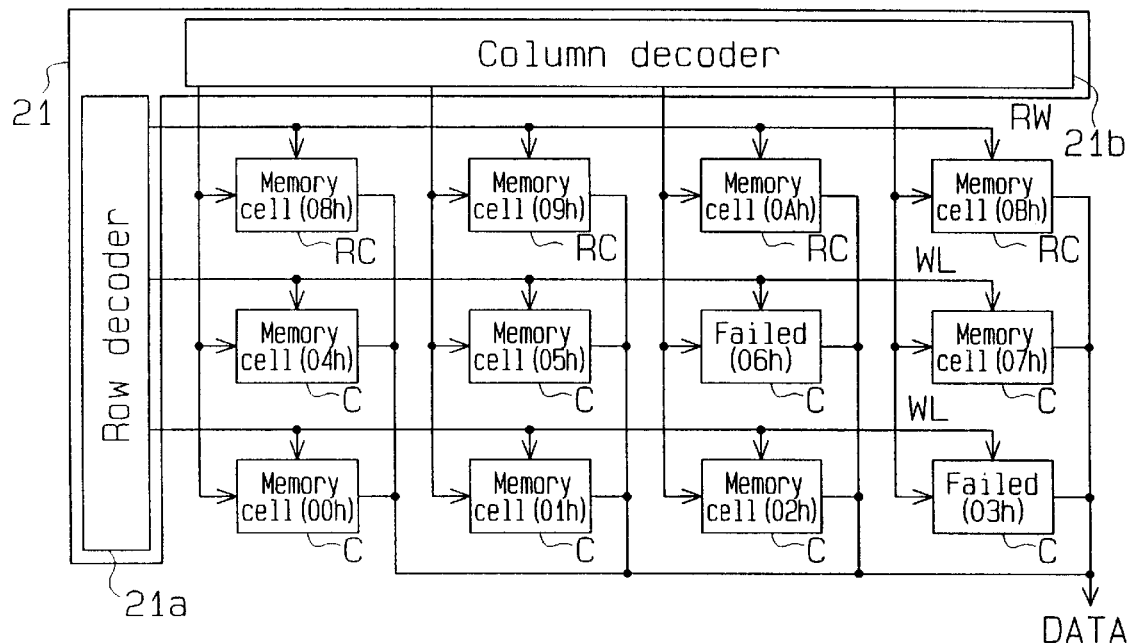
FIG. 8 is a schematic block diagram of a memory cell array having failed memory cells.

The operation of the semiconductor device according to the first embodiment will now be discussed with reference to an example of the memory cell array 22 which has eight memory cells C and four redundant memory cells RC, shown in FIG. 8. The individual memory cells C are accessed by external addresses ADDR "00h" (h: hexadecimal notation) to "07h" and the individual redundant memory cells RC are accessed by addresses "08h" to "0Bh". The address comparison circuit 24 includes four failure address comparators 26 corresponding to the four redundant memory cells RC, and the four comparators 26 respectively output decision signals C1–C4. The address switching circuit 25 has four failure address registers 28 for storing the addresses "0Bh" to "08h" of the redundant memory cells RC.

Figure 9:
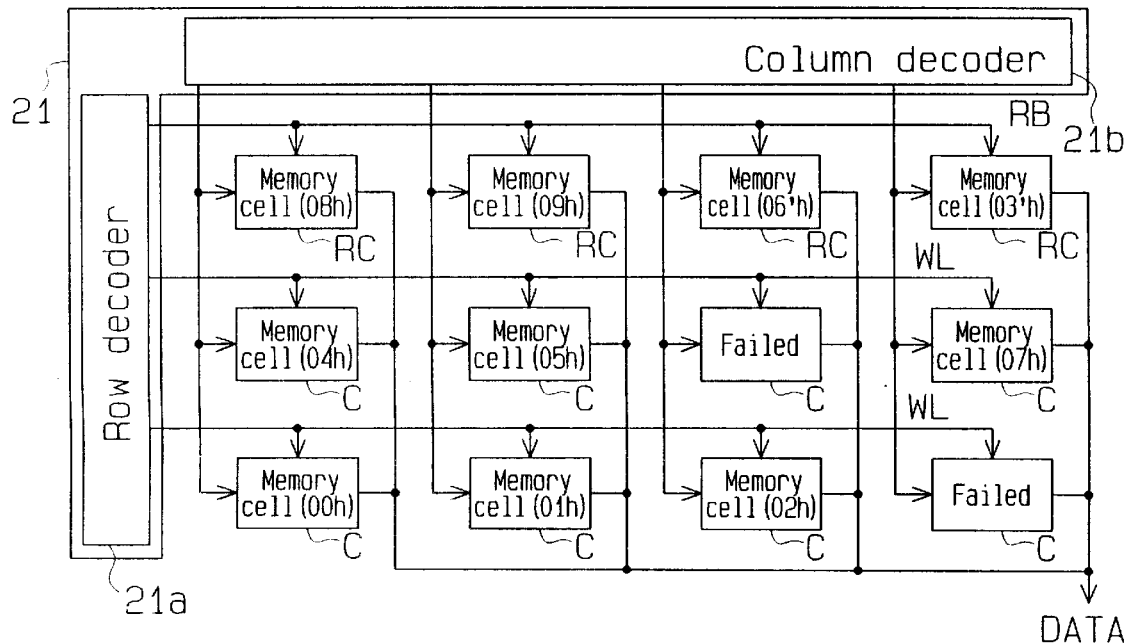
FIG. 9 is a schematic block diagram of the memory cell array whose failed memory cells have been replaced with redundant memory cells.

The internal circuit 12 and the memory are tested when the semiconductor device is connected to the testing device. In response to the test mode signal TM from the testing device, the testing circuit 15 detects failed memory cells at, for example, addresses 03h and 06h (FIG. 9). The testing circuit 15 stores the addresses 03h and 06h of the detected failed memory cells C in the respective two failure address registers 28.

The address switching circuit 25 and each failure address comparator 26 receive the external address ADDR in the normal mode of the semiconductor device. When the external address ADDR is "01h", for example, the external address ADDR does not coincide with the failure addresses stored in the two failure address registers 28, so the associated two comparators 27 send the decision signals C1 and C2 having a logic value of "0" (L level) to the address switching circuit 25. The two comparators 27 which are associated with two corresponding failure address registers 28, where no failure addresses are stored, generate the decision signals C3 and C4, both having a logic value of "0" (L level).

The first switch SWa of the address switching circuit 25 is set on by the operation of the NOR gate 29 which responds to the L-level decision signals C1–C4. As a result, the external address ADDR passes the first switch SWa and is supplied to the memory cell decoder 21 as the internal address NAD. The memory cell decoder 21 selects the memory cell C of the address "01h" in accordance with the internal address NAD (external address ADDR).

Figure 10:
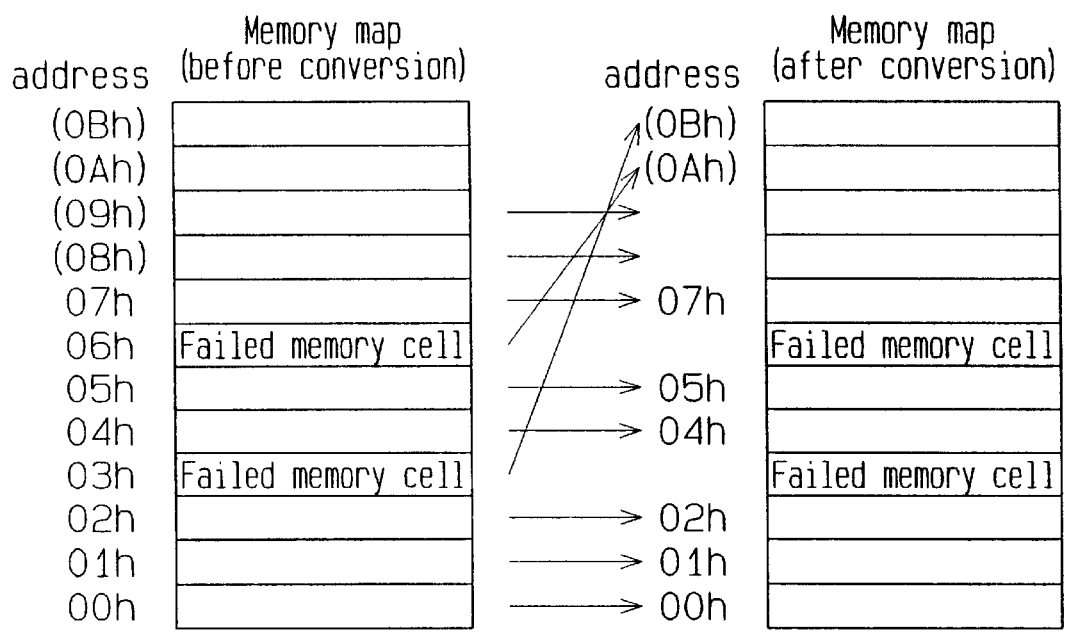
FIG. 10 shows a memory map before address conversion and a memory map after address conversion for correlation according to the first embodiment.

When the external address ADDR is "03h", for example, the external address ADDR matches with the failure address associated with the first comparator 27, so that the first comparator 27 generates the decision signal C1 having a logic value of "1" (H level). As the external address ADDR does not match with the failure address associated with the second comparator 27, the second comparator 27 generates the decision signal having a logic value of "0" (L level). The switch SWb1 is set on in response to the H-level decision signal C1 and the other switches SWb2–SWb4 are set off in response to the L-level decision signals C2–C4. The first switch Swa is also set off by the NOR gate 29 receiving the H level decision signal C1. In this manner, the redundant address "0Bh" stored in the redundant address register RR1 is output as the internal address NAD through the second switch SWb1. The memory cell decoder 21 selects the redundant memory cell RC3 at the address "0Bh" in accordance with the internal address NAD (redundant address). FIG. 10 shows memory maps before and after address conversion.

According to the first embodiment, when the external address ADDR coincides with any failure address, the external address ADDR is changed to a prestored redundant address, which is used in place of the failure address. Unlike in the prior art, therefore, the word line WL or the bit line BL which is associated with the failed memory cell is not physically disconnected. Thus, the other normal memory cells C which are connected to the word line WL or the bit line BL associated with the failed memory cell are effectively used. That is, it is possible to avoid the case where, in order to relieve a failed memory cell, the other normal memory cells become unusable or inaccessible.

Further, the test for detecting a failed memory cell has only to be performed on the memory cell array 22. Consequently, the test time for the semiconductor device is decreased. In other words, as a failed memory cell is replaced with a redundant memory cell by software or firmware, the test time is shortened.

According to the first embodiment, an external testing device may be used instead of the testing circuit 15 to detect any failed memory cell in the memory cell array 22 and store the failure address in the associated failure address register.

Figure 11:
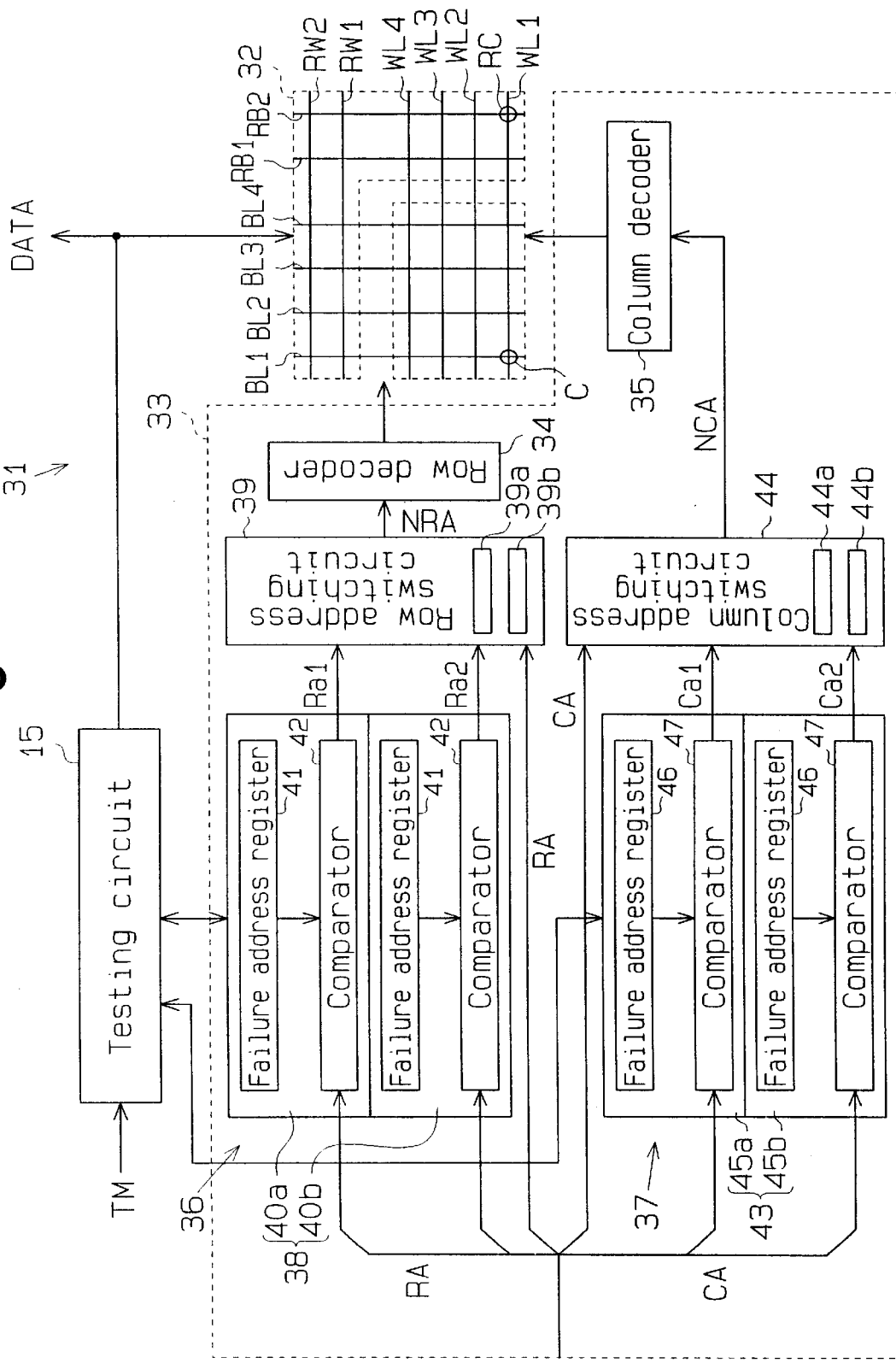
FIG. 11 is a schematic block diagram of a memory according to a second embodiment of the present invention.

Referring now to FIG. 11, a memory 31 according to a second embodiment of the present invention includes a memory cell array 32, a memory cell decoder 33 and a testing circuit 15. The memory cell array 32 has a plurality of (four in this case) word lines WL1 to WL4, a plurality of (four in this case) bit lines BL1 to BL4 and a plurality of memory cells C located at the intersections of the word lines WL1–WL4 and the bit lines BL1–BL4. The memory cell array 32 further has a plurality of (two in this case) redundant word lines RW1 and RW2, a plurality of (two in this case) redundant bit lines RB1 and RB2, and a plurality of redundant memory cells RC. The redundant memory cells RC are located at the intersections of the redundant word lines RW1 and RW2 and the bit lines BL1–BL4 and at the intersections of the word lines WL1–WL4 and the redundant bit lines RB1 and RB2. FIG. 11 shows one memory cell C located at the intersection of the word line WL1 and the bit line BL1, and one redundant memory cell RC located at the intersection of the word line WL1 and the redundant bit line RB2.

The memory cell decoder 33 has a row decoder 34, a column decoder 35, a row address converter 36 and a column address converter 37. The row decoder 34, connected to the word lines WL1–WL4 and the redundant word lines RW1 and RW2, selects one of the word lines WL1–WL4 in accordance with an external row address RA. The column decoder 35, connected to the bit lines BL1–BL4 and the redundant bit lines RB1 and RB2, selects one of the bit lines BL1–BL4 in accordance with an external column address CA.

The row address converter 36 converts the external row address RA which selects a word line associated with a failed memory cell to a redundant row address which selects a redundant word line associated with a redundant memory cell. The column address converter 37 converts the external column address CA which selects a bit line associated with a failed memory cell to a redundant column address which selects a redundant bit line associated with a redundant memory cell.

The row address converter 36 includes a row address comparison circuit 38 and a row address switching circuit 39. The row address comparison circuit 38 includes two address comparison circuits 40a and 40b associated with the two redundant word lines RW1 and RW2. Each of the address comparison circuits 40a and 40b includes a failure address register 41 and a comparator 42. Prestored in each failure address register 41 is a row address for selecting a word line associated with a failed memory cell which has been detected through the memory failure test by the testing circuit 15. Each comparator 42 receives the row address RA in the external address ADDR and compares the row address RA with the failure row address stored in the failure address register 41. When the row address RA coincides with the failure row address, an H-level decision signal Ra1 or Ra2 is supplied to the row address switching circuit 39. When the row address RA does not coincide with the failure row address, the decision signal Ra1 or Ra2 of an L level is supplied to the row address switching circuit 39. The row address switching circuit 39 sends the row address RA as an internal row address NRA to the row decoder 34 in response to the L-level decision signal Ra1 or Ra2. In response to the H-level decision signal Ra1 or Ra2, the row address switching circuit 39 sends the associated redundant row address as the internal row address NRA to the row decoder 34. The redundant row addresses are prestored in redundant address registers 39a and 39b.

The column address converter 37 includes a column address comparison circuit 43 and a column address switching circuit 44. The column address comparison circuit 43 includes two address comparison circuits 45a and 45b associated with the two redundant bit lines RB1 and RB2. Each of the address comparison circuits 45a and 45b includes a failure address register 46 and a comparator 47. Prestored in each failure address register 46 is a column address for selecting a bit line associated with a failed memory cell detected through the memory failure test by the testing circuit 15. Each comparator 47 receives the column address CA in the external address ADDR and compares the column address CA with the failure column address stored in the failure address register 46. When the column address CA coincides with the failure column address, an H-level decision signal Ca1 or Ca2 is supplied to the column address switching circuit 44. When the column address CA does not match with the failure column address, the decision signal Ca1 or Ca2 of an L level is supplied to the column address switching circuit 44. The column address switching circuit 44 sends the column address CA as an internal column address NCA to the column decoder 35 in response to the L-level decision signal Ca1 or Ca2. In response to the H-level decision signal Ca1 or Ca2, the column address switching circuit 44 sends the associated redundant column address as the internal column address NCA to the column decoder 35. The redundant column addresses are prestored in redundant address registers 44a and 44b.

Figure 12:
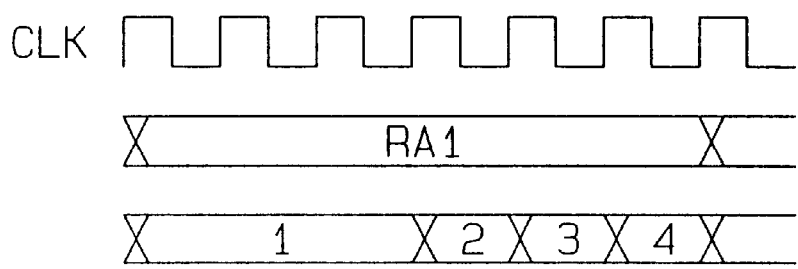
FIG. 12 is a timing chart illustrating the operation of the memory in FIG. 11.

The second embodiment is particularly effective for a so-called burst transfer or page mode access in which a plurality of memory cells are continuously accessed in accordance with the same row address, as shown in FIG. 12. The redundant row addresses for row addresses for selecting word lines associated with failed memory cells are prestored in the failure address registers 39a and 39b of the row address switching circuit 39. When a word line associated with a failed memory cell is selected, the row address switching circuit 39 sends a redundant row address RA1 to the row decoder 34 such that all of the memory cells connected to the word line associated with that failed memory cell are replaced with all of the redundant memory cells RC connected to the redundant word line RW1 or RW2. When the row address RA for selecting the word line associated with the failed memory cell matches with the failure row address, the row address RA is switched to the prestored redundant row address. According to the second embodiment, therefore, a plurality of memory cells in the same row including a failed memory cell are accessed at a high speed in accordance with one redundant row address RA1.

Figure 13:
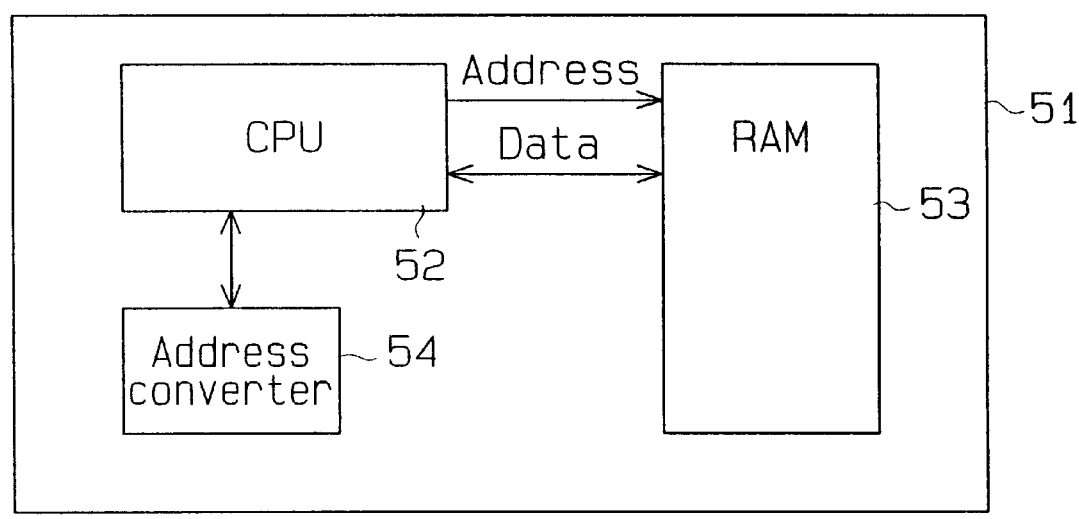
FIG. 13 is a schematic block diagram of a semiconductor device according to a third embodiment of the present invention.

As shown in FIG. 13, a semiconductor device 51 according to a third embodiment has a CPU 52, a memory 53 and an address converter 54, all formed on the same chip. The CPU 52, connected to the memory 53, accesses processing program data (command data) and various kinds of data stored in the memory 53, and performs an operation according to the command data or reads or writes various kinds of data from or to the memory 53. The memory 53 receives an address ADDR from the CPU 52, and selects a memory cell C or a redundant memory cell RC in accordance with that address ADDR. Data is read from, or written to, the selected memory cell. The address converter 54 has the same circuit design, generally, as the address converter 23 of the first embodiment. The address converter 54 receives the address ADDR from the CPU 52, and sends a redundant address as a converted address to the CPU 52 when the address ADDR coincides with a failure address. The CPU 52 receives the converted address from the address converter 54 and sends the converted address to the memory 53. In this manner, the CPU 52 directly accesses an associated redundant memory cell RC in accordance with the converted address.

Figure 14:
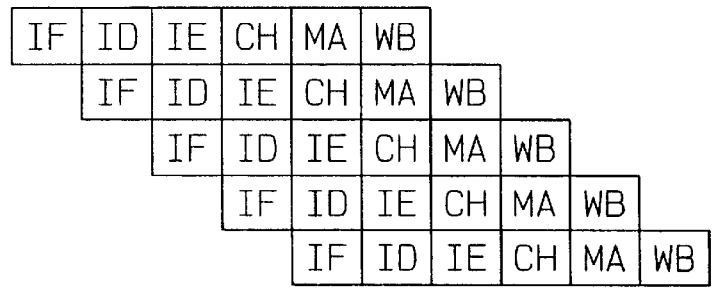
FIG. 14 shows a pipeline of a CPU of the semiconductor device in FIG. 13.

The CPU 52 executes a command in accordance with a pipeline system. As shown in FIG. 14, the CPU 52 has a plurality of (six in this case) pipeline stages IF, ID, IE, CH, MA and WB. The CPU 52 loads a command in the IF stage. In the stage, the CPU 52 loads a command, which is stored in a command cache register (not shown), into an internal register (not shown) of the CPU 52. In the ID stage, the CPU 52 decodes the command and determines the content of its operation. In the IE stage, the CPU 52 executes the decoded command. In the CH stage, address conversion associated with a failed memory cell in the memory cell array is performed. In the MA stage, the CPU 52 accesses the memory in accordance with the converted address. In the WB stage, the result of the command execution is written in the proper register. The number of the pipeline stages, their structures and their processing contents may be altered as needed.

The CPU 52 completes the operation of each stage within a predetermined time (cycle) in accordance with the system clock (operational frequency). If the pipeline has no cuts, each of the stages is executed in one cycle, and the CPU 52 writes the execution result in the proper register every cycle. This achieves fast processing.

According to the third embodiment, the CPU 52 has a CH stage for address conversion and an MA stage for accessing the memory 53 in accordance with the converted address. Even when the system clock (operational frequency) increases, therefore, the operation of the two stages CH and MA are executed. The CPU 52 thus performs a fast operation without dead cycles.

Figure 15A:
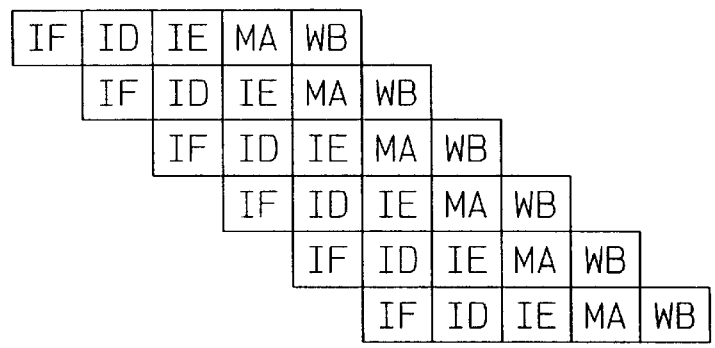
FIGS. 15A and 15B show a pipeline of a CPU of a semiconductor device in which the memory of the first or second embodiment and a CPU are combined.
Figure 15B:
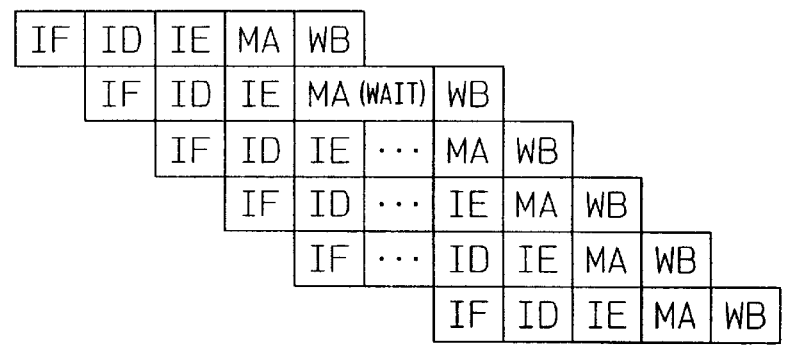

FIG. 15A shows pipeline stages of the CPU 52 in the semiconductor device where the CPU 52 in FIG. 13 and the address converter 54 of the first or second embodiment are fabricated on a single chip. The CPU 52 is provided with five pipeline stages IF, ID, IE, MA and WB. That is, the CPU 52 has no CH stage. If the system clock is increased, the time for each of the stages IF-WB is shortened. When the time for each of the stages IF-WB becomes shorter than the time for address comparison and switching by the address converter, a wait is inserted into the MA stage as shown in the second pipeline in FIG. 15B. The wait produces a dead cycle in the operation of the CPU 52, until the MA stage is completed. That is, the process is delayed by one cycle until the completion of the MA stage. This process delay may occur every time the MA stage is executed, reducing the throughput of the CPU 52.

In the third embodiment, the address converter 54 of the second embodiment may be used. In this case, the CPU 52 supplies the address ADDR to the address converter 54 in the fourth stage CH. The address converter 54 generates a row address and a column address from the address ADDR, and sends a redundant row (or column) address to the CPU 52 when the row (or column) address matches with a failure row (or column) address. In the next, fifth stage MA, the CPU 52 accesses the memory 53 in accordance with the address from the address converter 54.

It should be apparent to those skilled in the art that the present invention may be embodied in many other specific forms without departing from the spirit or scope of the invention. For example, the present invention may be embodied in a semiconductor memory device where only a memory is formed on a chip. Further, the present invention may be used with memory array of various sizes and including varying amounts of the redundant cells.

Therefore, the present examples and embodiments are to be considered as illustrative and not restrictive and the invention is not to be limited to the details given herein, but may be modified within the scope and equivalence of the appended claims.

What is claimed is:

1. A semiconductor memory device comprising:
   a memory cell array including a plurality of memory cells and a plurality of redundant memory cells;
   a decoder for selecting one of the plurality of memory cells in accordance with an external address;
   a failure address register for storing an address of a failed memory cell;
   a redundant address register for storing an address of a redundant memory cell;
   a comparator for comparing the external address with the address of the failed memory cell and generating a decision signal when the external address coincides with the address of the failed memory cell; and
   a switch for converting the external address supplied to the decoder with the address of the redundant memory cell in response to the decision signal.

2. The device according to claim 1, wherein the comparator, the failed address register and the redundant address register are provided in association with the number of the redundant memory cells.

3. The device according to claim 1, further comprising a testing circuit, connected between the memory cell array and the failure address register, for detecting the failed memory cell in the memory cell array and storing the address of the detected failed memory cell into the failure address register.

* * * * *